United States Patent
Kim et al.

(10) Patent No.: US 12,051,460 B2
(45) Date of Patent: Jul. 30, 2024

(54) APPARATUSES AND METHODS FOR SINGLE-ENDED SENSE AMPLIFIERS

(71) Applicant: MICRON TECHNOLOGY, INC., Boise, ID (US)

(72) Inventors: Tae H. Kim, Boise, ID (US); Christopher J. Kawamura, Boise, ID (US); Jiyun Li, Boise, ID (US)

(73) Assignee: Micron Technology, Inc., Boise, ID (US)

(*) Notice: Subject to any disclaimer, the term of this patent is extended or adjusted under 35 U.S.C. 154(b) by 7 days.

(21) Appl. No.: 17/447,490

(22) Filed: Sep. 13, 2021

(65) Prior Publication Data

US 2023/0084668 A1 Mar. 16, 2023

(51) Int. Cl.
| | |
|---|---|
| G11C 7/12 | (2006.01) |
| G11C 7/06 | (2006.01) |
| G11C 11/4091 | (2006.01) |
| G11C 11/4094 | (2006.01) |
| G11C 11/4097 | (2006.01) |
| G11C 11/4074 | (2006.01) |

(52) U.S. Cl.
CPC .......... G11C 11/4091 (2013.01); G11C 7/06 (2013.01); G11C 11/4094 (2013.01); G11C 11/4097 (2013.01); *G11C 7/12* (2013.01); *G11C 11/4074* (2013.01); *G11C 2207/002* (2013.01); *G11C 2207/005* (2013.01)

(58) Field of Classification Search
CPC ....... G11C 7/12; G11C 7/065; G11C 11/4085; G11C 7/06; G11C 11/4074; G11C 11/4091; G11C 11/4094
See application file for complete search history.

(56) References Cited

U.S. PATENT DOCUMENTS

| | | | | |
|---|---|---|---|---|
| 4,982,363 | A * | 1/1991 | Sood | G11C 7/067 365/207 |
| 5,469,393 | A | 11/1995 | Thomann | |
| 7,894,286 | B2 | 2/2011 | Jung et al. | |
| 9,431,094 | B1 | 8/2016 | Takai | |
| 10,839,873 | B1 * | 11/2020 | Lee | G11C 7/1048 |
| 11,152,055 | B1 | 10/2021 | Lee | |
| 2001/0028593 | A1 * | 10/2001 | Sekiguchi | G11C 11/4097 365/230.03 |

(Continued)

OTHER PUBLICATIONS

U.S. Appl. No. 17/662,198 titled "Apparatuses and Methods for Compensated Sense Amplifier With Crosscoupled N-Type Transistors" filed May 5, 2022, all pages of application as filed.

(Continued)

*Primary Examiner* — Mushfique Siddique

(74) *Attorney, Agent, or Firm* — Dorsey & Whitney LLP

(57) ABSTRACT

Apparatuses, systems, and methods for single-ended sense amplifiers. A memory device may include a number of sense amplifiers used to read the voltage of memory cells along digit lines. Double-ended sense amplifiers are coupled to two digit lines. Single-ended sense amplifiers are coupled to a single digit line. The memory cells of an edge word line of a memory array may alternately be coupled to a single-ended sense amplifier or a double-ended sense amplifier. The use of single-ended sense amplifiers may reduce a footprint for a given number of memory cells in the array.

13 Claims, 10 Drawing Sheets

(56) References Cited

U.S. PATENT DOCUMENTS

| | | | |
|---|---|---|---|
| 2002/0000860 A1* | 1/2002 | Dai ................... | H03K 5/1534 |
| | | | 327/211 |
| 2002/0101771 A1 | 8/2002 | Lee et al. | |
| 2002/0118576 A1 | 8/2002 | Ohba et al. | |
| 2011/0002152 A1* | 1/2011 | Lane ................... | G11C 29/04 |
| | | | 365/207 |
| 2014/0119093 A1* | 5/2014 | Singh ................... | G11C 7/062 |
| | | | 365/207 |
| 2018/0357007 A1* | 12/2018 | Zawodny ................ | G11C 7/06 |
| 2019/0392877 A1* | 12/2019 | Kawamura ............. | G11C 8/18 |
| 2020/0075082 A1* | 3/2020 | Derner ............... | G11C 11/4091 |
| 2022/0020421 A1* | 1/2022 | Kadowaki .......... | G11C 11/4091 |

OTHER PUBLICATIONS

U.S. Appl. No. 16/934,909 titled "Apparatuses Including Threshold Voltage Compensated Sense Amplifiers and Methods for Compensating Same" filed Jul. 21, 2020, pp. all pages of application as filed.

* cited by examiner

APPARATUSES AND METHODS FOR SINGLE-ENDED SENSE AMPLIFIERS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), which in turn may be coupled to a sense amplifier. Along with the digit line coupled to the memory cell, a second, complimentary digit line may also be coupled to the sense amplifier. The use of complimentary digit lines may be useful for providing a reference voltage level to better distinguish the value being read from/written to the memory cell. However, this may require the use of dedicated reference digit lines, for example at the edges of the memory array, which may increase the size of the memory array. There is increasingly a need for memory devices with reduced size.

DETAILED DESCRIPTION

Figure 1:
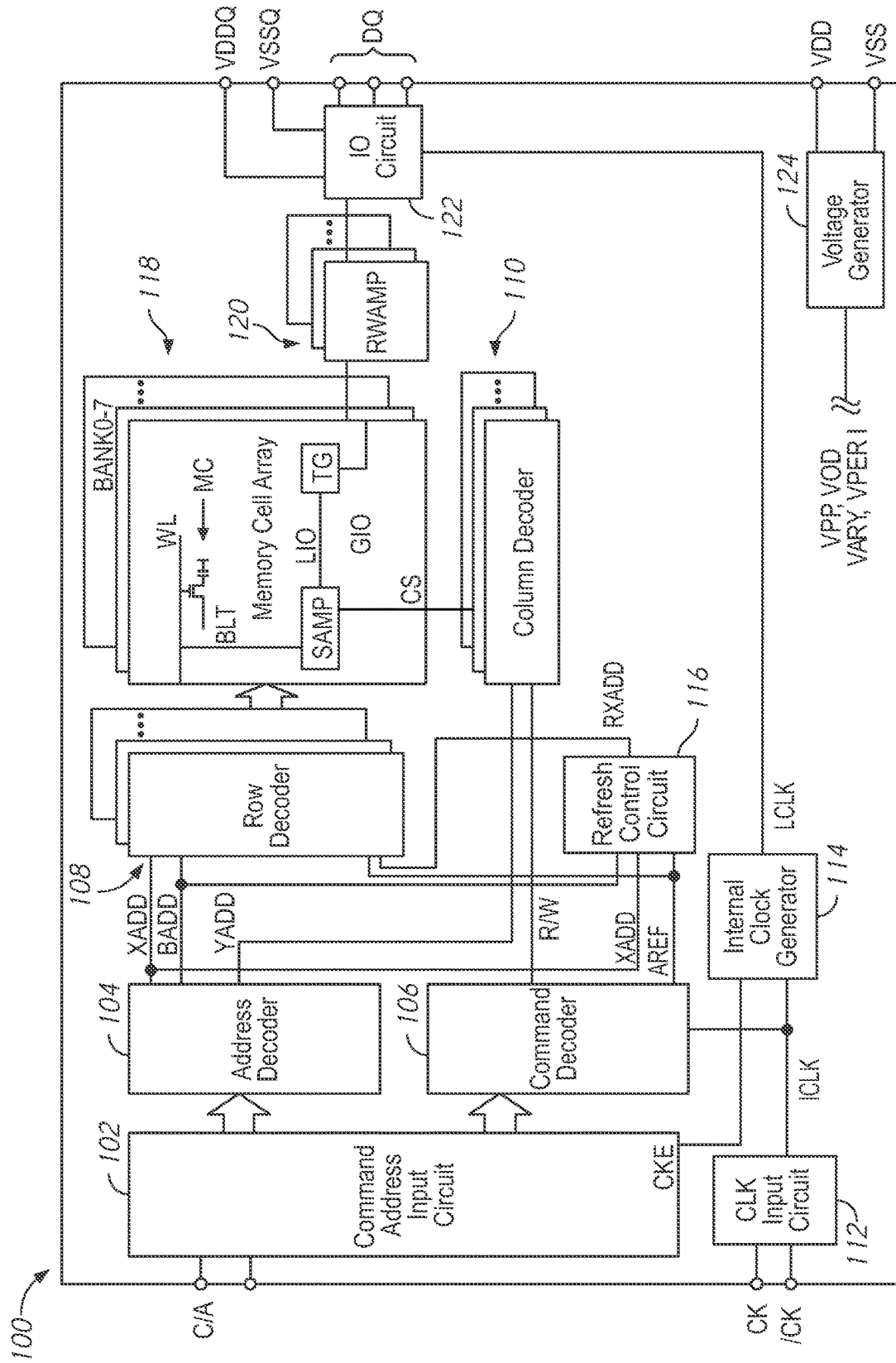
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory devices may include a memory array which includes a number of memory cells, each of which may store information. For example, each memory cell may store a single bit of information. The memory cells may be located at the intersections of word lines (rows) and digit lines (bit lines/columns). Each word line may be associated with a row address, and each digit line may be associated with a column address. Accordingly, memory cells may be specified by their row and column addresses. When a memory cell is accessed (e.g., a read or write operation), the memory cell may be coupled via the bit line to a sense amplifier. For example in a read operation, the value stored in the memory cell (e.g., as a capacitive charge) may change a voltage of the bit line. The sense amplifier may detect this change, amplify the voltage to a system level (e.g., a voltage which represents logical high or a voltage which represents logical low) and then provide those voltages along a local input/output line (LIO) and global input/output line (GIO) to read/write amplifiers, which in turn may send the voltage to data terminals of the memory. During an example write operation, the process may generally be reversed (e.g., from GIO to LIO, to sense amplifier to bit line to memory cell).

In a conventional memory device, the sense amplifier, may use a complimentary, double-ended architecture. In a double-ended architecture, the sense amplifier may be coupled to a first digit line, which is coupled to the accessed memory cell, and a second digit line. The second digit line may be used as a reference. The use of complimentary digit lines may be useful for differentiating between different voltages (e.g., by comparing the complimentary values). Double ended sense amplifiers may be coupled between a pair of adjacent word lines, with the two couple digit lines coupled to a respective memory cell of the two word lines. During operation, one word line may be activated to read out data from the activated memory cell along the first digit line, while the second digit line may act as a reference. However, this may present problems along edges of the memory array, since the first and last row will not have another row along the outside. In a conventional memory, this may lead to the word lines along the outside edges to have half as many memory cells. As there is an increasing need to reduced size of memory devices, it may be useful to have single-ended sense amplifiers, for example to allow for increased density of memory cell in edge word lines.

The present disclosure is drawn to apparatuses, systems, and methods for single-ended sense amplifiers. Conventional double-ended sense amplifiers may have two input terminals, one coupled to a digit line carrying a voltage based on data stored in a memory cell, and one coupled to a reference (e.g., along a digit line coupled to a reference voltage). A single-ended sense amplifier may have a single input terminal coupled to the digit line carrying the voltage based on the data. The single ended sense amplifier may include a first inverter with an input coupled to a digit line and an output coupled to first gut node. The first gut node may be coupled to the input of a second inverter which has an output node coupled to a second gut node. The second gut node is coupled to the input of the first inverter. The single-ended sense amplifier may have a metastable state which is perturbed by the voltage along the digit line. Based on how the metastable state is disturbed, the single-ended sense amplifier may drive the digit line to a voltage which represents a high or low logical level. The digit line may then be coupled to local input/output line (LIO) to indicate the value read from the memory cell.

In an example application, a memory array may include a first and second word line, where the first word line is an edge word line of the memory array. A set of double-ended sense amplifiers may be disposed between the first and second word line. Each of the double-ended sense amplifiers has a pair of input terminals, one coupled to a memory cell on the first word line and a second input coupled to a memory cell on the second word line. A set of single-ended sense amplifiers may be disposed next to the first word line (e.g., but not next to the second word line). The single-ended sense amplifiers may each have a single input terminal coupled to a memory cell along the first word line. Accordingly, each memory cells along the first word line may be coupled to a single-ended or double-ended sense amplifier (e.g., alternately along the word line). There may be as many memory cells along the first word line as along the second word line.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BLT, and a plurality of memory cells MC arranged at intersections of the plurality of word lines WL and the plurality of bit lines BLT. The selection of the word line WL is performed by a row decoder 108 and the selection of the bit lines BLT is performed by a column decoder 110. In the embodiment of FIG. 1, the row decoder 108 includes a respective row decoder for each memory bank and the column decoder 110 includes a respective column decoder for each memory bank. The bit lines BLT are coupled to a respective sense amplifier (SAMP). Read data from the bit line BLT is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BLT.

The memory device 100 may include a mixture of single-ended sense amplifiers which are coupled to a single bit line or digit line BLT and double-ended sense amplifiers which are coupled to two digit lines BLT and BLB. Examples of the different types of sense amplifiers and their arrangement in a memory device is described in more detail herein.

The semiconductor device 100 may employ a plurality of external terminals, such as solder pads, that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The memory 100 may include single-ended sense amplifiers each of which has an input terminal coupled to a digit line BLT which carries a voltage based on a memory cell. The single-ended sense amplifier also has a number of terminals coupled to various control signals which the row decoder 108 and/or column decoder 110 may provide to operate the sense amplifier during various operations. The memory array 118 may also include double-ended sense amplifiers.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
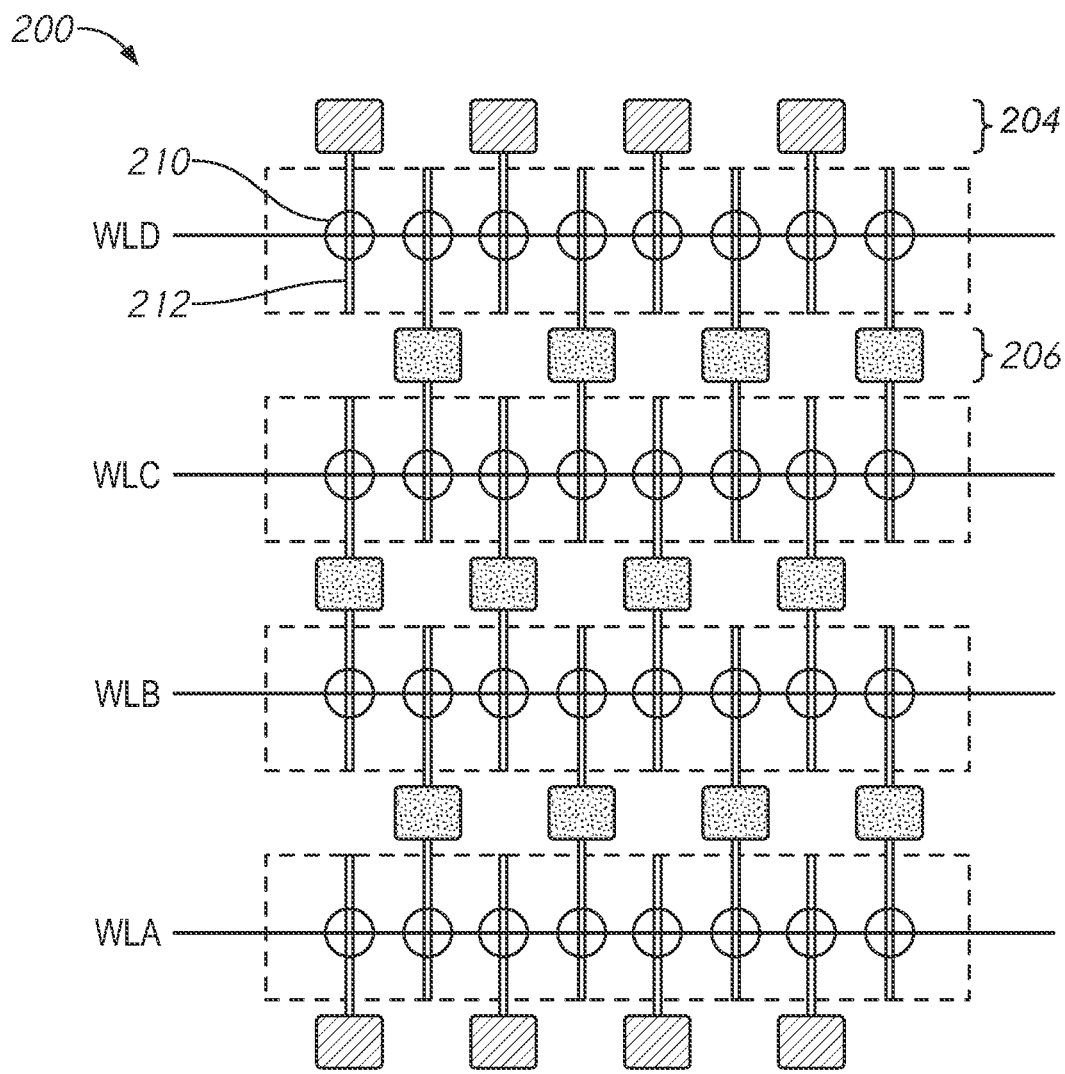
FIG. 2 is a block diagram of a memory array according to some embodiments of the present disclosure.

FIG. 2 is a block diagram of a memory array according to some embodiments of the present disclosure. The memory array 200 may, in some embodiments, be included in the memory array 118 of FIG. 1. The memory array 200 shows a simplified view of a memory array, with four word lines WLA to WLD, each of which includes 8 memory cells 210. It should be understood that a memory array may include many more word lines and/or memory cells per word line. While the embodiment of FIG. 2 shows an example embodiment with a mix of single-ended and double-ended sense amplifiers arranged in a specific pattern, it should be understood that other embodiments may include other methods of using and arranging single-ended sense amplifiers in a memory array.

The memory array 200 has four word lines WLA, WLB, WLC, and WLD. The word lines WLA and WLD are edge word lines of the memory array 200, each of which is a first (or last) word line of the array, with only one adjacent word line. For example, word line WLA is adjacent to word line WLB and word line WLD is adjacent to word line WLC. Word lines WLB and WLC are interior word lines to the memory array 200, each of which is adjacent to two other word lines (e.g., word line WLC is adjacent to WLD and WLB, and word line WLB is adjacent to WLC and WLA). Each word line has a number of memory cells 210 disposed along the word line at the intersection of that word line and a digit line 212.

Groups of double-ended sense amplifiers 206 are disposed between adjacent word lines. Groups of single-ended sense amplifiers 204 are disposed adjacent a single word line (e.g., to the edge word lines WLA and WLD). Bit lines 212 couple each memory cell to a sense amplifier, either a single ended sense amplifier 204 or a double-ended sense amplifier 206.

Each double ended sense amplifier 206 is coupled to two digit lines, one coupled to a memory cell 210 in each of the two word lines that the sense amplifier 206 is positioned between. During an access operation, one digit line may be used to read out data, while the other may be used as a reference. Along the interior word lines WLB and WLC, all of the memory cells 210 are coupled to double ended sense amplifier 206. Along the word line the memory cells may alternate which adjacent group of double ended sense amplifiers they are coupled to. For example, along the word line WLC, a first memory cell is coupled to a sense amplifier 206 which is also coupled to a first memory cell of WLB, the second memory cell is coupled to a sense amplifier 206 which is also coupled to the second memory cell of WLD and so forth.

Each single ended sense amplifier 204 is coupled to a single digit line 212 to a memory cell 210 in an edge row of the memory array 200. Accordingly, along an edge row, the memory cells 210 may alternate between being coupled to a single ended sense amplifier or a double ended sense amplifier 206. For example a first memory cell along WLD is coupled to a single ended sense amplifier 204, a second memory cell along WLD is coupled to a double ended sense amplifier 206 which is also coupled to the second memory cell along WLC and so forth.

Since there is no need to set aside certain bit lines to act as permanent reference digit lines for the single-ended sense amplifiers, each of the edge row memory (e.g., WLA and WLD) may have the same number of memory cells as the interior rows (e.g., instead of half as many memory cells if half the bit lines are set aside for reference). Accordingly, a memory array using the layout shown in FIG. 2 may include one fewer row for the same number of memory cells.

Example single-ended sense amplifiers, which may be used as the single-ended sense amplifier 204, are described in more detail in FIGS. 3A-8B. An example double-ended sense amplifier, which may be used as the double-ended sense amplifier 206, is described in more detail in FIG. 9. In some embodiments, any double-ended sense amplifier known in the art may be used as the double-ended sense amplifier 206.

Figure 3A:
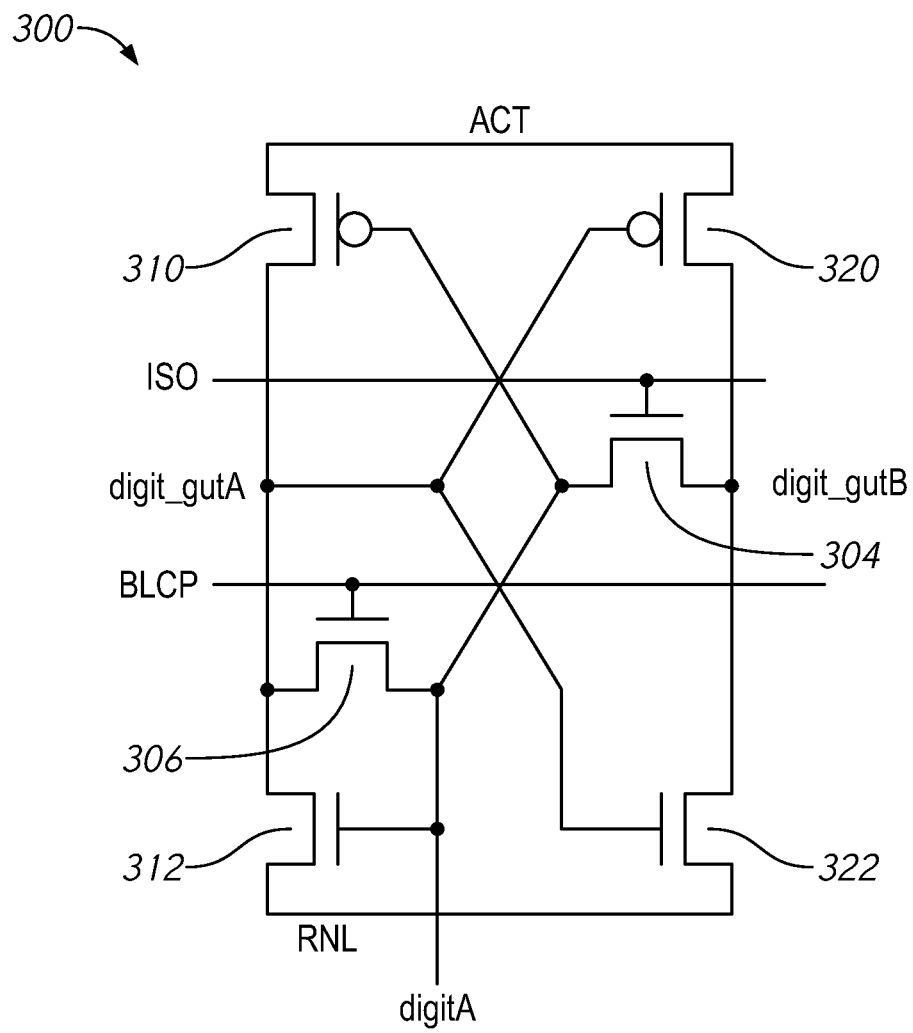
FIGS. 3A-3B are schematic diagrams of a single-ended sense amplifier according to some embodiments of the present disclosure.
Figure 3B:
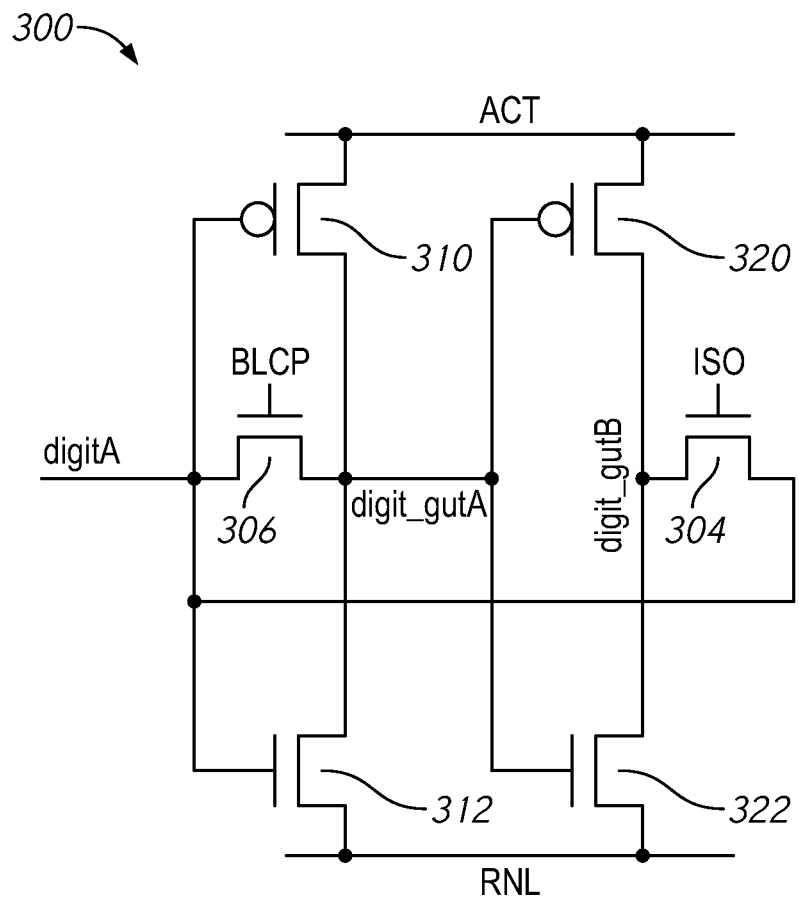

FIGS. 3A-3B are schematic diagrams of a single-ended sense amplifier according to some embodiments of the present disclosure. The single ended sense amplifier 300 may, in some embodiments, be included in the sense amplifier SAMP of FIG. 1 and/or one of the sense amplifiers 204 of FIG. 2. FIGS. 3A and 3B show different layouts of the same single ended sense amplifier 300. The views of FIGS. 3A and 3B only differ in layout as a guide to make it easier to picture the operation of the circuit. Accordingly, for brevity the two Figures use the same reference numbers and will be described together.

The sense amplifier 300 is shown coupled to system voltage lines ACT and RNL, which may be charged with power voltages to activate the amplifier. For example, during an access operation, the voltage line ACT may be charged to a system voltage, such as VDD, which represents a high logical level, while the voltage line RNL may be charged to a ground voltage such as VSS.

The sense amplifier 300 includes a first inverter circuit, which includes two transistors 310 and 312. The first inverter has an input coupled to the digit line (here labelled digitA) and an output node coupled to a first gut node digit_gutA. The first transistor 310 has a source coupled to ACT, a drain coupled to digit_gutA, and a gate coupled to digitA. The first transistor 310 may be a p-type transistor. The second transistor 312 has a source coupled to RNL, a drain coupled to digit_gutA and a gate coupled to digitA. The second transistor 312 may be an n-type transistor. Accordingly, when the signal digitA is at a high enough voltage, the transistor 312 will be active and the transistor 310 will be inactive, coupling digit_gutA to RNL through the transistor 312. When the signal digitA is at a low enough voltage, the transistor 312 may be inactive while the transistor 310 may be active, coupling digit_gutA to an ACT through transistor 310.

The sense amplifier 300 includes a second inverter which includes two transistors 320 and 322. The second inverter may generally be similar to the first inverter, except with an input node coupled to digit_gutA and an output node coupled to digit_gutB. The second inverter includes a third transistor 320 has a source coupled to ACT, a drain coupled to digit_gutB, and a gate coupled to digit_gutA. The third transistor 320 may be a p-type transistor. The fourth transistor 322 has a source coupled to RNL, a drain coupled to digit_gutB and a gate coupled to digit_gutA. The fourth transistor 322 may be an n-type transistor. Accordingly, when the signal digit_gutA is at a high enough voltage, the transistor 322 will be active and the transistor 320 will be inactive, coupling digit_gutB to RNL through the transistor 322. When the signal digit_gutA is at a low enough voltage, the transistor 322 may be inactive while the transistor 320 may be active, coupling digit_gutB to ACT through transistor 320.

The sense amplifier 300 also has two additional transistors coupled to control signals BLCP and ISO respectively, which may be used to operate the sense amplifier 300 during a sensing operation. An example sensing operation is described in more detail in FIG. 4.

A fifth transistor 306 has a source coupled to digitA, a drain coupled to digit_gutA and a gate coupled to BLCP. The fifth transistor may be a n-type transistor. Accordingly, when BLCP is active, the transistor 306 may be active, which may couple digitA to digit_gutA.

A sixth transistor 304 has a source coupled to digit_gutB, a drain coupled to digitA and a gate coupled to an isolation signal ISO. The sixth transistor 304 may be a n-type transistor. Accordingly, when ISO is active, the transistor 304 may be active and may couple digit_gutB to digitA.

An additional column select transistor (not shown) may couple the digit line digitA to a local/input output line LIO (and from there to global input/outputs and the DQ pads of the memory). When a column select signal CS (e.g., provided by column decoder 110 of FIG. 1) is active, the column select transistor may be active and couples the voltage on the digit line digitA to LIO.

Figure 4:
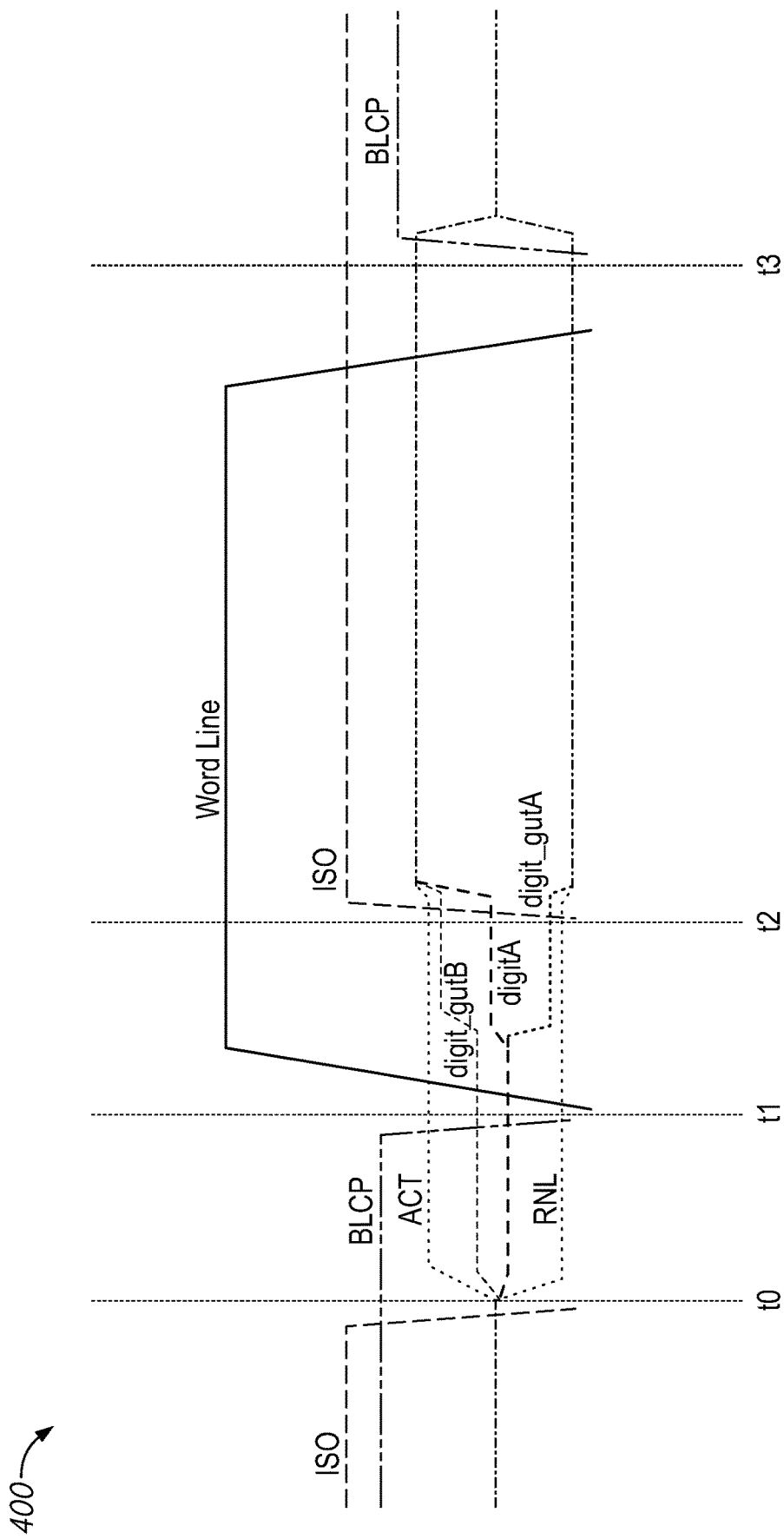
FIG. 4 is a chart of an example sensing operation according to some embodiments of the present disclosure.

FIG. 4 is a chart of an example sensing operation according to some embodiments of the present disclosure. The chart 400 shows an example operation of a single ended sense amplifier such as the single ended sense amplifier 300 of FIGS. 3A-3B. The chart 400 is representational and not to scale, and different traces shown are not necessarily to the same scale. The chart 400 shows time along a horizontal axis, and voltage along a vertical axis, with a low voltage generally representing a logical low, while a high voltage represents a logical high.

Before an initial time t0, the signals ISO and BLCP are active (e.g., at a high logical level), while the signals ACT, RNL, digit_gutA, digit_gutB, and digitA are all held at a pre-charge level which is between a logical high and a logical low voltage (e.g., about halfway between VDD and VSS). Since ISO and BLCP are both at an active level, transistors 304 and 306 of FIG. 3 may be active, which may short the digitA, digit_gutA and digit_gutB together.

At the initial time t0, the signal ISO is deactivated (e.g., driven to a low logical level), and the signals ACT and RNL may be driven to a high voltage (e.g., VDD) and low voltage (e.g., VSS) respectively. This may put the single ended sense amplifier in a metastable state. Since the signal BLCP is still active, digitA may still be coupled to digit_gutA. Although since ISO is now inactive, digit_gutB is no longer directly coupled to digit A.

At a first time t1, the signal BLCP may be deactivated (e.g., to decouple digitA and digit_gutA) which may put the sense amplifier in a sensing or pre-sensing mode. At t1, the word line coupled to the memory cell that digitA is coupled to is activated. This causes the memory cell to activate and drive a voltage of digitA based on the logical value stored in the memory cell. In this case, the example memory cell holds a high logical level (e.g., a high voltage). Accordingly, after t1, the voltage on the digit line digitA may increase. This in turn may cause the gut voltage digit_gutA to fall (e.g., since it is inverted from digitA). The fall of the gut voltage digit_gutA may be greater than the positive swing of digitA, since the voltages ACT and RNL are a larger difference than the voltage driven by the memory cell along digitA. The fall of digit_gutA may cause digit_gutB to also rise, since digit_gutB is inverted from digit_gutA. Since ISO is inactive this may create a feedback which continues to drive the voltage digitA up.

At a second time t2, the sense amplifier may enter a latching or sensing mode, where the signal ISO is activated. This may "freeze" the operation of the circuit, locking in the higher voltages along digitA and digit_gutB and the lower voltage along digit_gutA. At this point, the information along the digit line digitA may be latched or otherwise sensed. For example, a column select transistor may be activated and the voltage along digitA may be coupled to an LIO line as part of a read operation.

At a third time t3, the sense amplifier may enter an equalizing mode, and the word line is deactivated, the signal BLCP is activated again, and the voltages ACT and RNL are driven to a mid-point voltage (e.g., between VDD and VSS). This may reset the sense amplifier and prepare it for a next sensing operation.

Figure 5:
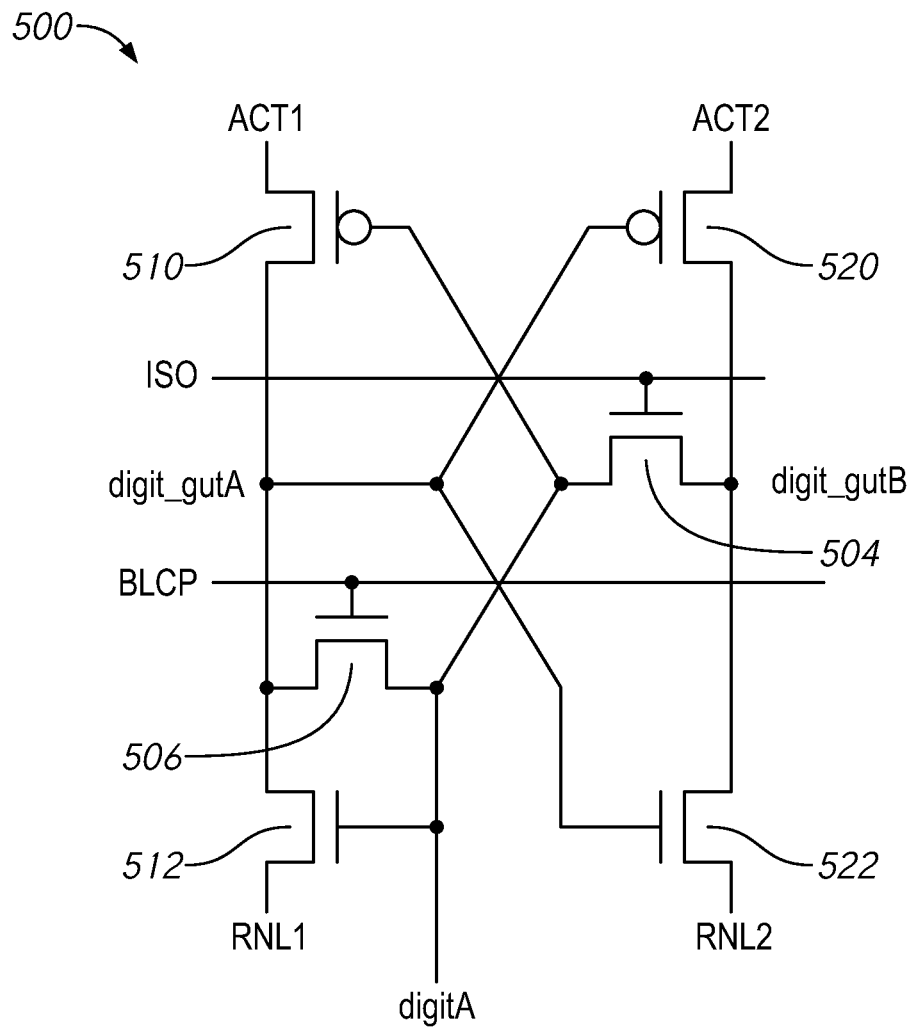
FIG. 5 is a schematic diagram of a single-ended sense amplifier according to some embodiments of the present disclosure.

FIG. 5 is a schematic diagram of a single-ended sense amplifier according to some embodiments of the present disclosure. The single-ended sense amplifier 500 may, in some embodiments, be included as one of the single-ended sense amplifiers 204 of FIG. 2. The single-ended sense amplifier 500 may be generally similar to the sense amplifier 300 of FIGS. 3A-3B. For the sake of brevity, features, components and operations similar to those described with respect to the sense amplifier 300 will not be repeated with respect to sense amplifier 500.

The sense amplifier 500 may be similar to the sense amplifier 300 of FIG. 3A-3B, except that the sense amplifier 500 has separate power signals for the two inverter circuits rather than having the two inverters share ACT in common and share RNL in common. For example, the transistor 510 has a source coupled to a signal ACT1 and the transistor 512 has a source coupled to a signal RNL1. Meanwhile the transistor 520 has a source coupled to ACT2 and the transistor 522 has a source coupled to a signal RNL2. For example, if the signal on digitA is high, then a voltage RNL1 may be applied to digit_gutA, which in turn may cause a voltage ACT2 to be applied to digit_gutB.

The use of the different signals ACT1 and ACT2 and RNL1 and RNL2 may allow for the inverters to operate at different voltage levels. The voltage ACT1 may be different from ACT2 and the voltage RNL1 may be different from the voltage RNL2. This may allow the two inverter circuits to have different levels of amplification. For example, if the difference between the voltage ACT2 to RNL2 is greater than the difference between ACT1 to RNL2, then the second inverter will have a greater amplification than the first inverter. In some embodiments, the different sets of voltages may be activated at different times in order to control an operation of the circuit with more precise control. For example, FIG. 7 describes an embodiment where the transistor 504 is eliminated by controlled operation of the voltages ACT1, ACT2, RNL1, and RNL2.

Figure 6:
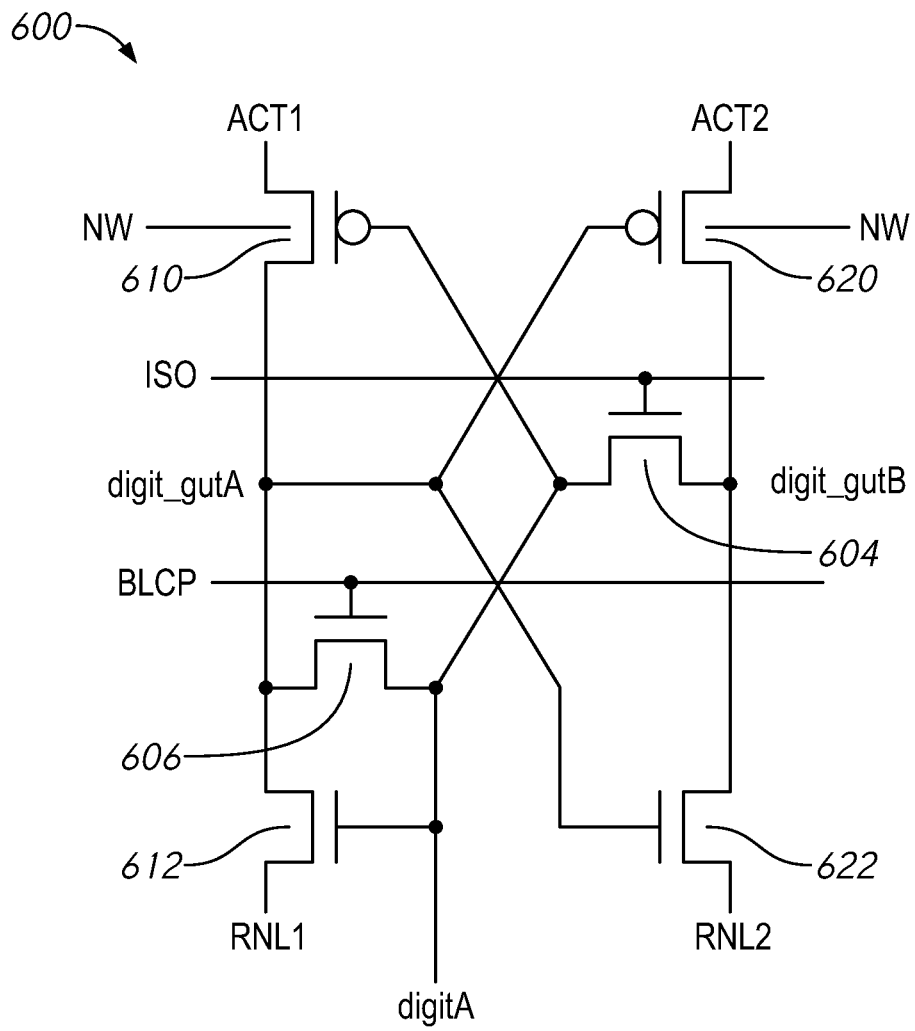
FIG. 6 is a schematic diagram of a single-ended sense amplifier according to some embodiments of the present disclosure.

FIG. 6 is a schematic diagram of a single-ended sense amplifier according to some embodiments of the present disclosure. The single-ended sense amplifier 600 may, in some embodiments, be included as one of the single-ended sense amplifiers 204 of FIG. 2. The single-ended sense amplifier 600 may be generally similar to the sense amplifier 300 of FIGS. 3A-3B and/or the sense amplifier 500 of FIG. 5. For the sake of brevity, features, components and operations similar to those described with respect to the sense amplifiers 300 and 500 will not be repeated with respect to sense amplifier 600.

The single-ended sense amplifier 600, may generally be similar to the single-ended sense amplifier 500 of FIG. 5, except that in the sense amplifier 600, the transistors 610 and 620 are adjustable. The transistors 610 and 620 may have a voltage NW applied to their substrates, which may control a leakage current Ioff of the transistors 610 and 620. The voltage NW may be dynamically adjusted (e.g., by the column decoder 110 of FIG. 1 and/or some other control circuit of the sense amplifier 600) to reduce the leakage current Ioff when the voltages ACT1, ACT2, RNL1 and RNL2 are off. Pull and pull-down devices which may provide the voltages ACT1, ACT2, RNL1 and/or RNL2 are described in more detail in FIGS. 8A-8D.

The sense amplifier 600 of FIG. 6, similar to the sense amplifier 500 of FIG. 5, is shown with separate voltage lines for each of the inverters 610, 612, 620, and 622 (e.g., ACT1 and ACT2 are different, and RNL1 and RNL2 are different). However, in some embodiments, the transistors 610 and 620, and the transistors 612 and 622 may be coupled in common to single voltage rail (e.g., a single ACT and RNL respectively), similar to the embodiment of FIGS. 3-4.

Figure 7:
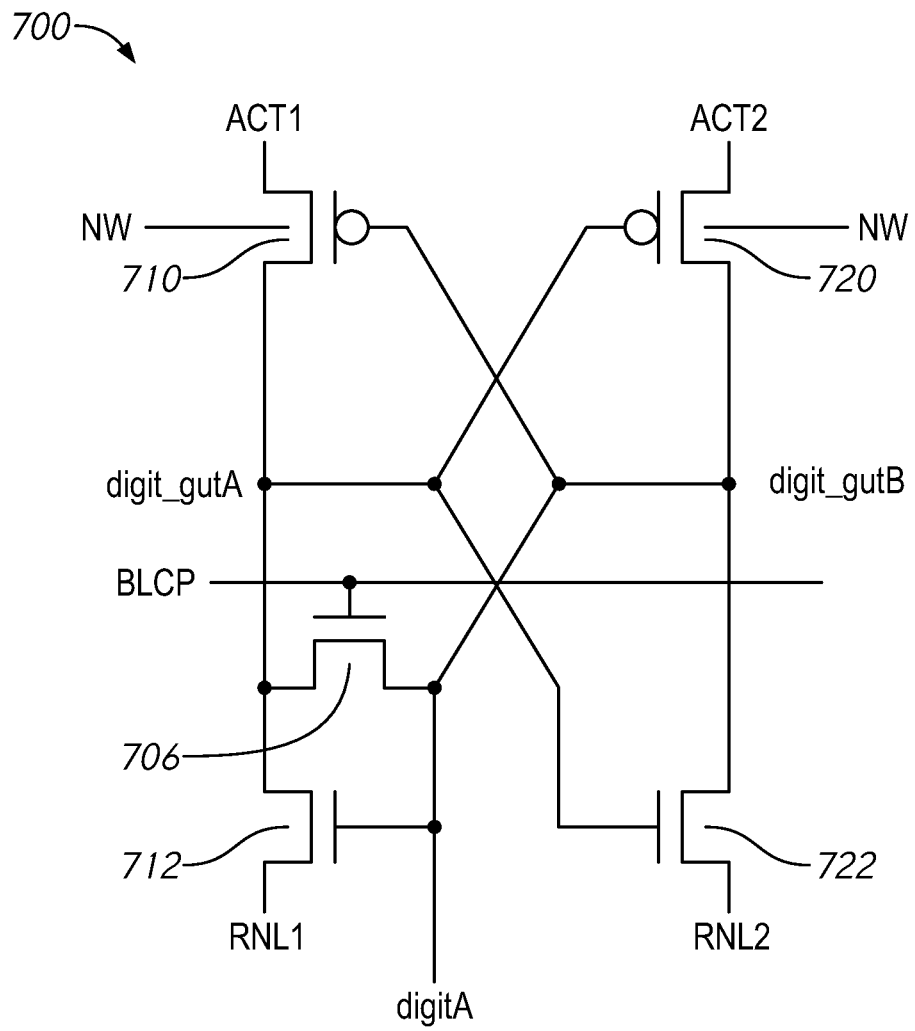
FIG. 7 is a schematic diagram of a single-ended sense amplifier according to some embodiments of the present disclosure.
Figure 8A:
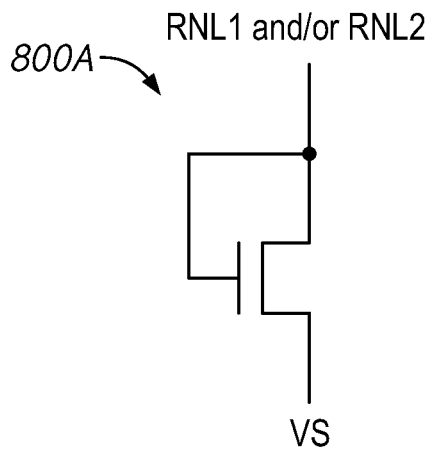
FIGS. 8A-8D show pull-up and pull-down drivers according to some embodiments of the present disclosure.
Figure 8B:
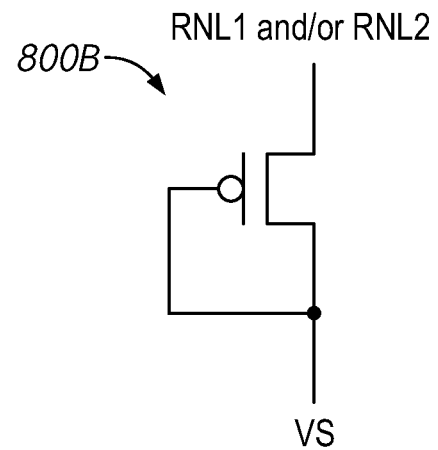
Figure 8C:
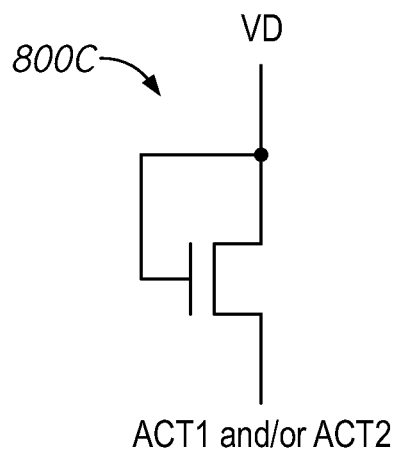
Figure 8D:
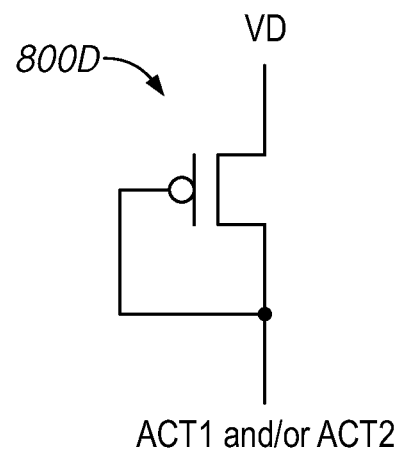

FIG. 7 is a schematic diagram of a single-ended sense amplifier according to some embodiments of the present disclosure. The single-ended sense amplifier 700 may, in some embodiments, be included as one of the single-ended sense amplifiers 204 of FIG. 2. The single-ended sense amplifier 700 may be generally similar to the sense amplifier 300 of FIGS. 3A-3B, 500 of FIGS. 5 and/or 600 of FIG. 6. For the sake of brevity, features, components and operations similar to those described with respect to the sense amplifiers 300, 500, and/or 600 will not be repeated with respect to sense amplifier 700.

The sense amplifier 700, similar to the sense amplifiers 500 and 600, has different voltages coupled to each of the two inverters (e.g., an ACT1 and ACT2 and an RNL1 and an RNL2). However, in contrast to the sense amplifiers 300, 500 and 600, the sense amplifier 700 eliminates the signal ISO and its corresponding transistor (e.g., in the amplifier 700, the signal digit_gutB is directly coupled to the gates of transistors 710 and 712 rather than being coupled through a transistor.

The voltages ACT1, ACT2, RNL1, and RNL2 may be separately controlled during a sense operation. For example, instead of activating a signal ISO to couple a gut node digit_gutB to a digit line digitA, the voltages may be used to turn the two inverters (e.g., 710/712 and 720/722) on and off at different times. For example the first inverter (e.g., transistors 710 and 712) may be on at a first time with the voltage line ACT1 coupled to a system voltage VD and the voltage line RNL1 coupled to a ground voltage VS, while the second inverter (e.g., transistors 720 and 722) is off with the voltage lines ACT2 and RNL2 allowed to float. Similarly, at other times the second inverter may be on (e.g., ACT2 coupled to VD, RNL2 coupled to VS) while the first inverter is off (e.g., ACT1 and RNL1 floating). At other times both or neither of the inverters may be active. For example during an example sense operation, when the signal BLCP becomes inactive, the first inverter may be active, and then instead of activating an ISO signal, the second transistor may be activated to latch the data in the sense amp.

The sense amplifier 700 is shown as including transistors 710 and 720 which have adjustable leakage currents, controlled by a voltage NW, similar to the sense amplifier 600 of FIG. 6. However, the adjustable transistors 710 and 720 are optional, and in some embodiments, the voltage NW may be eliminated and the transistors 710 and 720 may operate with a fixed leakage current (e.g., similar to the amplifiers 300 of FIG. 3 and 500 of FIG. 5).

FIGS. 8A-8D show pull-up and pull-down leakage control circuits according to some embodiments of the present disclosure. The pull-up and pull-down leakage control circuits may, in some embodiments, be used to control a leakage current from the drivers (not shown) of the voltages ACT, RNL, ACT1, ACT2, RNL1, and/or RNL2 in any of FIGS. 3, 4, 5, 6, and/or 7. The leakage control circuits 800A-800D may be transistors set up in a diode fashion to limit the leakage of current between the sense amplifier(s) and the drivers which provide the voltages to operate those sense amplifier(s).

The leakage control circuits 800A and 800B show leakage control circuits which may be used to couple a ground voltage VS to a voltage line RNL, RNL1 and/or RNL2. The embodiment of 800A uses an n-type transistor, while the embodiment of 800B uses a p-type transistor, each coupled in a diode fashion. The drivers 800C and 800D show leakage control circuits which may be used to couple a system voltage VD to a voltage line ACT, ACT1 and/or ACT2. The embodiment of 800C uses an n-type transistor, while the embodiment of 800D uses a p-type transistor each coupled in a diode fashion. For the sake of brevity, the labels RNL and ACT will be used to indicate RNL, RNL1, and/or RNL2, and ACT, ACT1, and/or ACT2 respectively.

The driver 800A includes an n-type transistor with source coupled to VS, a drain coupled to RNL and a gate coupled to RNL. Accordingly, when RNL has a higher voltage than VS, the transistor will activate and couple the voltage line RNL to VS. When RNL has a low voltage (e.g., VS), the transistor will deactivate, clamping the voltage on RNL and decoupling RNL from VS to prevent leakage.

The driver 800B includes a p-type transistor with a drain coupled to VS, a source coupled to RNL, and a gate coupled to VS. Accordingly, when VS is at a lower voltage than RNL, the transistor may activate and couple VS to RNL. When RNL is at a similar or lower voltage than VS, the transistor will deactivate, and the voltage line RNL will be decoupled from VS to prevent leakage.

The driver 800C includes an n-type transistor with a drain coupled to a system voltage VD, a source coupled to ACT, and a gate coupled to VD. When the voltage VD is higher than the voltage ACT, the transistor may activate. When the voltage on ACT is close enough (or higher than) VD, the transistor may inactivate, decoupling ACT and VD to prevent leakage.

The driver 800D includes a p-type transistor with a source coupled to VD, a drain coupled to ACT, and a gate coupled to ACT. When the voltage on ACT is lower than VD, the transistor will be active coupling VD to the ACT. When the voltage on ACT is close to (or above) VD, then the transistor will be inactive, decoupling VD from ACT to prevent leakage.

The use of the leakage control circuits 800A, 800B, 800C, and/or 800D may help save power by reducing the power lost through a leakage current Ioff. In some embodiments, the leakage control circuits 800A, 800B, 800C, and/or 800D may be coupled with embodiments that use transistors with an adjustable leak current (e.g., as controlled by a voltage NW) to further reduce loss of power via leakage current.

Figure 9:
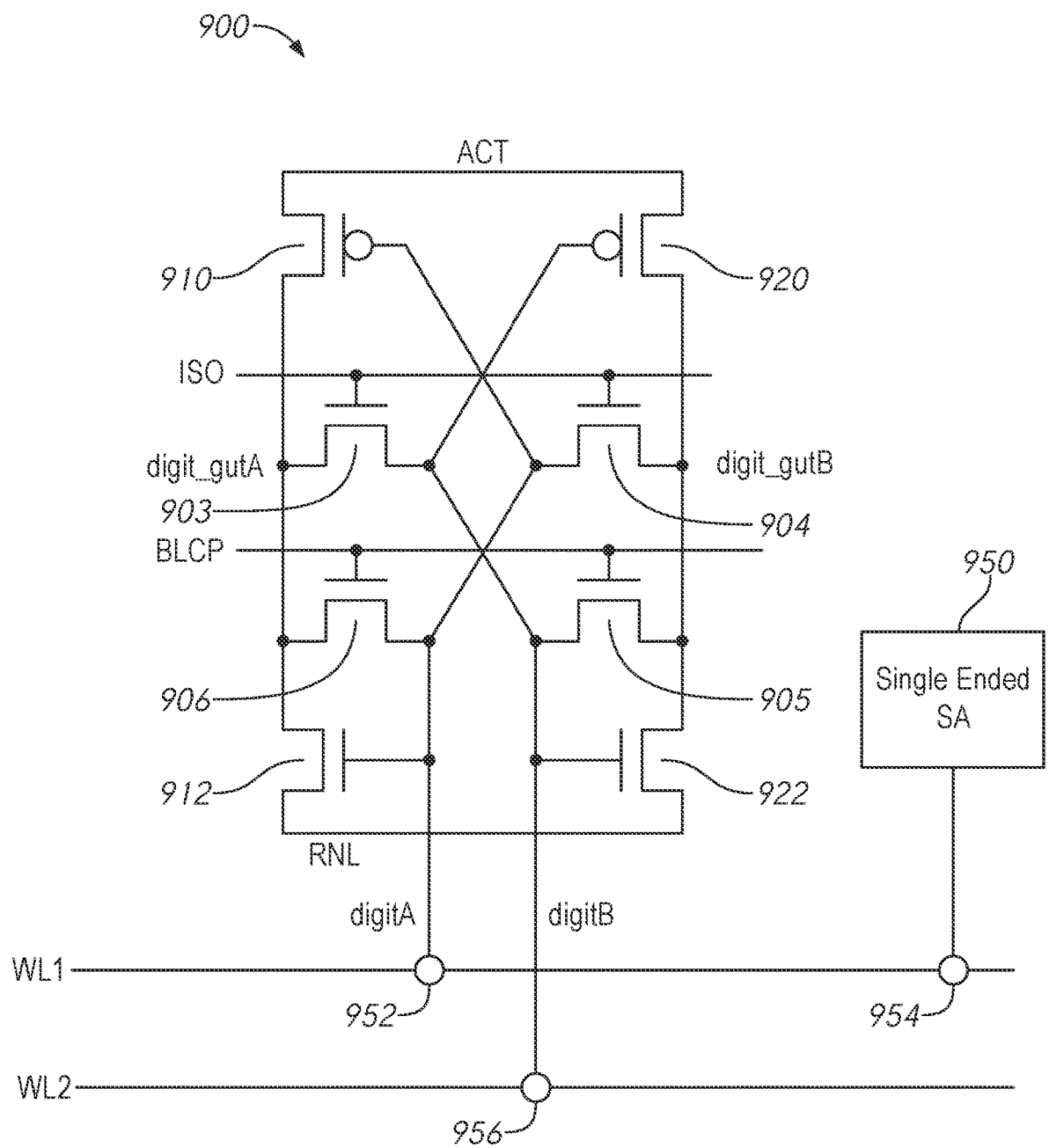
FIG. 9 is a schematic diagram of a double-ended sense amplifier and single-ended sense amplifier according to some embodiments of the present disclosure.

FIG. 9 is a schematic diagram of a double-ended sense amplifier and single-ended sense amplifier according to some embodiments of the present disclosure. As described with respect to FIG. 2, a memory array may include a mix of single-ended and double-ended sense amplifiers (e.g., 204 and 206 of FIG. 2 respectively). Any of the previously described sense amplifiers (e.g., FIGS. 3, 4, 6, 7, and/or 8) may be used to implement the single ended sense amplifier 950. The double-ended sense amplifier 900 of FIG. 9 may, in some embodiments, be used to implement the double ended sense amplifiers (e.g., 206 of FIG. 2). Other double-ended sense amplifiers, for example any double-ended sense amplifier known in the art, may be used in other example embodiments.

The double ended sense amplifier 900 and the single-ended sense amplifier 950 are shown coupled to respective memory cells 952, 954, and 956 along word lines WL1 and WL2. The layout may be similar to FIG. 2, but for illustration purposes, unlike FIG. 2, the sense amplifiers 900 is not shown positioned between two word lines (although it may be positioned in that way in some chip layouts). The word line WL1 may represent an edge word line of a memory array (e.g., WLA or WLD of FIG. 2). The memory cell 954 is adjacent to the memory cell 952 along word line WL1. Memory cells 952 and 956 are coupled to a double-ended sense amplifier 900, while memory cell 954 is coupled to a single-ended sense amplifier 950.

The double-ended sense amplifier may generally be similar to the single ended sense amplifier 300 of FIGS. 3A-3B. For the sake of brevity, operations and components previously described with respect to FIGS. 3A-3B will not be repeated with respect to FIG. 9. In the double-ended sense amplifier 900, there are two input terminals, coupled to a first digit line digitA and a second digit line digitB which are coupled to respective memory cells 952 along word line WL1 and 956 along word line WL2. During an access operation one of the digit lines may be used to carry data (e.g., be coupled to a memory cell along an active word line) while the other digit line may carry a reference voltage. For example, if the memory cell 952 is accessed, then digitA may carry data, while digitB may carry the reference voltage.

The second digit line digitB is coupled to the input of a second inverter (e.g., to the gates of transistors 920 and 922). The second digit line is also coupled through a transistor 905 to the second node digit_gutB. The transistor 905 has a source coupled to digitB, a drain coupled to digit_gutB and a gate coupled to a signal BLCP. The transistor 905 may be an n-type transistor. The digit line digitB is also coupled through a transistor 903 to the first gut node digit_gutA. The transistor 903 has a source coupled to digit_gutA, a drain coupled to digitB, and a gate coupled to the isolation signal ISO. The transistor 903 may also be an n-type transistor.

During an example sense operation, the two digit lines digitA and digitB are first driven to a reference voltage (e.g., halfway between a voltage which represents a high logical level and a voltage which represents a low logical level). One of the digit lines may be coupled to a memory cell along an active word line, while the other digit line may be kept as a reference. As the read charge from the memory cell perturbs the digit line it is coupled to, it will drive that digit line in one direction while the other digit line is driven in the other direction. For example if digitA is coupled to a memory cell holding a high logical value, then the voltage of digitA (and digit_gutB) will increase while the voltage of digitB (and digit_gutA) will decrease.

In some embodiments, the double-ended sense amplifier 900 may include offset cancellation by splitting the signal and power lines so that they are not commonly controlled. For example, the voltage ACT may be split into an ACT_A and ACT_B and the voltage RNL may be split into RNLA_A and RNL_B, analogous to ACT1/ACT2 and RNL1/RNL2 of FIG. 7. Similarly, the signals ISO and BLCP may be split into an ISO_A which operates transistor 903, an ISO_B which operates transistor 904, BLCP_A which operates transistor 906, and BLCP_B which operates transistor 905.

In some embodiments, additional transistors (not shown) may act as switches between the double-ended sense amplifier 900 and the memory cells 952 and 956. These transistors may have gates coupled to respective array isolation signals ArrayISO_A and ArrayISO_B. The array isolation signals may be used to isolate the double-ended sense amplifier from one or both of the coupled digit lines digitA and digitB.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A single-ended sense amplifier comprising:
a digit line;
a first gut node;
a second gut node;
a first transistor coupled between a first voltage line and the first gut node, with a gate coupled to the digit line;
a second transistor coupled between a second voltage line and the first gut node, with a gate coupled to the digit line;
a third transistor coupled between a third voltage line and the second gut node, with a gate coupled to the first gut node;
a fourth transistor coupled between a fourth voltage line and the second gut node, with a gate coupled to the first gut node;
a fifth transistor coupled between the digit line and the first gut node, with a gate coupled to a first control signal;
a sixth transistor coupled between the second gut node and the digit line, with a gate coupled to a second control signal; and
a controller configured to inactivate the second control signal at a first time, inactivate the first control signal at a second time, and activate the first control signal at a third time.

2. The single-ended sense amplifier of claim 1, wherein the first voltage line and the third voltage line are coupled to a first voltage in common, and wherein the second voltage line and the fourth voltage line are coupled to a second voltage in common.

3. The single-ended sense amplifier of claim 1, wherein the first transistor and the third transistor are n-type transistors, and wherein the second transistor and the fourth transistor are p-type transistors.

4. A single-ended sense amplifier comprising:
a digit line;
a first gut node;
a second gut node;
a first transistor coupled between a first voltage line and the first gut node, with a gate coupled to the digit line;
a second transistor coupled between a second voltage line and the first gut node, with a gate coupled to the digit line;
a third transistor coupled between a third voltage line and the second gut node, with a gate coupled to the first gut node;
a fourth transistor coupled between a fourth voltage line and the second gut node, with a gate coupled to the first gut node; and
a fifth transistor coupled between the digit line and the first gut node, with a gate coupled to a control signal;
wherein the first transistor and the third transistor have an adjustable leakage current.

5. An apparatus comprising:
a memory array comprising a first word line and a second word line each comprising a respective plurality of memory cells, wherein the first word line is positioned along an edge of the memory array;
a plurality of double-ended sense amplifiers each coupled to a memory cell along the first word line and a memory cell along the second word line; and
a plurality of single-ended sense amplifiers each coupled to a memory cell along the first word line, wherein each single-ended sense amplifier of the plurality of single-ended sense amplifiers includes:
a first gut node;
a second gut node;
a first transistor coupled between a first voltage line and the first gut node, with a gate coupled to a digit line coupled to a respective one of the plurality of memory cells along the first word line;
a second transistor coupled between a second voltage line and the first gut node, with a gate coupled to the digit line;
a third transistor coupled between a third voltage line and the second gut node, with a gate coupled to the first gut node;
a fourth transistor coupled between a fourth voltage line and the second gut node, with a gate coupled to the first gut node;
a fifth transistor coupled between the digit line and the first gut node, with a gate coupled to a control signal; and
a sixth transistor coupled between the second gut node and the digit line, with a gate coupled to a second control signal.

6. The apparatus of claim 5, wherein the first word line and the second word line each include the same number of memory cells.

7. The apparatus of claim 5, wherein the plurality of memory cells along the first word line are alternately coupled to one of the plurality of single-ended sense amplifiers or one of the plurality of double-ended sense amplifiers.

8. The apparatus of claim 5, wherein the first voltage line and the third voltage line are coupled to a first voltage in common, and wherein the second voltage line and the fourth voltage line are coupled to a second voltage in common.

9. A single-ended sense amplifier comprising:
a first inverter circuit having an input coupled to a digit line and an output coupled to a first node;
a second inverter circuit having an input coupled to the first node and an output coupled to a second node, wherein at least one of the first inverter circuit or the second inverter circuit is coupled to a leakage control circuit which includes a transistor with a drain shorted to its gate; and a transistor configured to selectively couple the digit line to the first node.

10. The single-ended sense amplifier of claim 9, further comprising a second transistor configured to selectively couple the second node to the digit line.

11. The single-ended sense amplifier of claim 9, wherein the digit line is coupled to a first memory cell, and wherein a second memory cell adjacent to the first memory cell is coupled to a double-ended sense amplifier.

12. The single-ended sense amplifier of claim 9, wherein the first inverter circuit and the second inverter circuit are coupled in common to a first voltage and a second voltage.

13. The single-ended sense amplifier of claim 9, wherein the first inverter circuit is coupled to a first voltage and a second voltage, and the second inverter circuit is coupled to a third voltage and a fourth voltage.

* * * * *